United States Patent [19]

Carroll

[11] Patent Number: 4,797,803
[45] Date of Patent: Jan. 10, 1989

[54] SWITCHING POWER SUPPLY VCO

[75] Inventor: David T. Carroll, Sonoma, Calif.

[73] Assignee: DCI Technology, Sonoma, Calif.

[21] Appl. No.: 137,788

[22] Filed: Dec. 23, 1987

[51] Int. Cl.⁴ ............................................. H02M 3/24
[52] U.S. Cl. ...................................... 363/95; 363/26; 363/97; 363/134
[58] Field of Search ................... 363/21, 26, 41, 95, 363/97, 134

[56] References Cited

U.S. PATENT DOCUMENTS 4,347,559 8/1982 Sturgeon .............................. 363/21
4,680,693 7/1987 Carron ................................. 363/98

Primary Examiner—Patrick R. Salce
Assistant Examiner—Jeffrey Sterrett
Attorney, Agent, or Firm—Brian D. Ogonowsky; Alan H. MacPherson; Paul J. Winters

[57] ABSTRACT

An inventive oscillator, inter alia, is disclosed which can be used to generate a frequency modulated control signal or a pulsewidth modulated control signal for application to a switching means in a switching power supply. The output voltage of a power supply is used to control the magnitude of a high bias voltage and a low bias voltage applied to a plus terminal of a voltage comparator, wherein when the output of the voltage comparator is high, the high bias voltage is applied to the plus terminal, and when the output of the voltage comparator is low, the low bias voltage is applied to the plus terminal. A capacitor, coupled to the output of the voltage comparator via a resistor, is coupled between the minus terminal of the voltage comparator and a ground so that when the output of the voltage comparator is high the capacitor charges. When the voltage across the capacitor exceeds that of the high bias voltage, the output of the voltage comparator goes low, discharging the capacitor until the voltage across the capacitor reaches the low bias voltage now applied to the plus terminal of the voltage comparator. The output of the voltage comparator then goes high, and the cycle repeats, thus generating a squarewave output corresponding to the output voltage of the power supply.

5 Claims, 4 Drawing Sheets

SWITCHING POWER SUPPLY VCO

BACKGROUND

1. Field of the Invention

This invention relates to switching power supplies and in particular to an improvement in a control circuit used to control the output voltage of a switching power supply.

2. Description of the Prior Art

FIG. 1 is a schematic diagram of a symmetrical half-bridge switching power supply. It is to be noted that the novel features disclosed herein are directly applicable to other symmetrical power supplies, wherein a switching means drives current symmetrically positive and negative through a magnetic device, and to nonsymmetrical switching power supplies, wherein current is driven through a magnetic device in one direction only.

The power supply circuit of FIG. 1 uses AC-DC rectifier 10 to rectify an AC input voltage. Capacitor C4, in parallel with rectifier 10, filters the rectified AC voltage to provide a DC input voltage $V_{in}$ at the drain of switching transistor Q1. Switching transistor Q2 is in series with transistor Q1 and has its source coupled to ground. Transistors Q1 and Q2 are alternately driven by regulator circuit 20. Capacitor C5 has a first terminal coupled to the source of transistor Q1 and the drain of transistor Q2 and has a second terminal coupled to inductor L3, wherein inductor L3 is connected in series with primary winding W1 of power transformer T3. When transistor Q1 is switched on and transistor Q2 is switched off, voltage $V_{in}$ is applied across the series combination of capacitor C5, inductor L3, and winding W1. As indicated by the dot notation on windings W1, W2, and W3 of power transformer T3, when transistor Q1 is on and transistor Q2 is off, a voltage appears across secondary winding W2 of power transformer T3 which forward biases output rectifying diode D2 at approximately 0.7 volts above the voltage across filtering capacitor C7. This rectified and filtered signal is further filtered by inductor L4 and capacitor C8 in order to supply a DC output voltage $V_{out}$.

When transistor Q1 is switched off and transistor Q2 is switched on, shorting the first terminal of capacitor C5 to ground, the direction of current through winding W1 reverses and causes the voltage across windings W2 and W3 of power transformer T3 to reverse. The voltage across winding W3 now forward biases output rectifying diode D3 and is filtered by capacitor C7, capacitor C8, and inductor L4 to provide DC output voltage $V_{out}$.

Output voltage $V_{out}$ is sensed by voltage sense/isolation circuit 15, which provides isolation between the input and output sections of the power supply and generates a feedback signal based on the difference between $V_{out}$ and a reference voltage. This feedback signal is then applied to regulator circuit 20, which adjusts the switching frequency of transistors Q1 and Q2 accordingly to adjust $V_{out}$. An increased switching frequency results in a lower $V_{out}$ mainly due to the increased impedance of inductance L3 and winding W1 at the higher frequencies. The inclusion of capacitor C5 allows a switching resonant frequency for a maximum $V_{out}$. The typical regulator circuit used in these types of symmetrical switching power supplies requires a relatively expensive voltage controlled oscillator to generate a switching frequency corresponding to the amplitude of the feedback signal from voltage sense/isolation circuit 15.

In a typical non-symmetrical switching power supply, such as that described in the Background of a co-pending application entitled, "An Improved Voltage Regulator Circuit", by David T. Carroll, Ser. No. 07/137,787, Filed Dec. 29, 1987, submitted herewith and incorporated by reference, a relatively expensive pulsewidth modulator circuit is required to modulate the duty cycle of a switching means to adjust the power supply output voltage.

The prior art circuit of FIG. 1 also requires a low voltage power suply to power the voltage regulator circuits. This low voltage power is usually solely supplied by tapping a voltage from a voltage divider network coupled between DC input voltage $V_{in}$ and ground or by a line operated transformer. The low voltage power supply is, in these prior art circuits, inefficient since they generate constant power regardless of frequency, and thus the power not used to charge the gates of the switching power transistors is lost as heat.

SUMMARY

An inventive oscillator is herein disclosed which can be used to generate a frequency modulated control signal or a pulsewidth modulated control signal to a switching means in a switching power supply. Also disclosed herein is a more efficient low voltage power supply for powering voltage regulator circuits in a switching power supply. In the preferred embodiment of the invention, an improved drive circuit is also disclosed which alternately drives two transistors in a push-pull type converter. Also disclosed is an improved over-current sense feature.

In my inventive oscillator, a capacitor is connected between a minus(−) terminal of a voltage comparator and ground, with a resistor connected between the minus(−) terminal and the output terminal of the voltage comparator so that when the output of the voltage comparator goes high, the capacitor will charge and increase the voltage at the minus(−) terminal of the voltage comparator. Conversely, when the voltage comparator output is low, the capacitor will discharge and lower the voltage at the minus(−) terminal of the voltage comparator. The plus(+) terminal of the voltage comparator has alternately applied to it a high bias voltage and a low bias voltage, the difference in voltage between the high bias and low bias voltage being determined by a feedback error signal corresponding to the output voltage of the power supply. The output of the voltage comparator is coupled so that when its output is high, the high bias voltage is applied to the plus(+) terminal of the voltage comparator. The high output of the voltage comparator causes the capacitor to charge. When the capacitor voltage exceeds that at the plus(+) terminal of the voltage comparator, the output of the voltage comparator goes low, coupling the low bias voltage to the plus(+) terminal of the voltage comparator and discharging the charge on the capacitor. The capacitor discharges until it is below the voltage at the plus(+) terminal, causing the output of the voltage comparator to go high, and thus repeating the cycle. Since the magnitude of the feedback error signal changes the voltage difference between the high and low bias voltages, a change in the feedback error signal changes the frequency of the squarewave produced at the output of the voltage comparator—this frequency corresponding to the output voltage of the power supply. The squarewave output of the voltage comparator is then applied to a switching means, wherein the switching frequency controls the magnitude of the power supply output voltage.

By fixing the high bias voltage and allowing the low bias voltage to fluctuate with a changing power supply output voltage, a pulsewidth modulated quasi-squarewave output may be obtained to control the duty cycle of a switching means, wherein the duty cycle controls the magnitude of the power supply output voltage. Thus, this oscillator may be used to either modulate the duty cycle of a switching means or to modulate the switching frequency of the switching means depending on the application.

The low voltage supply required to power the voltage regulator circuit is made highly efficient by conserving the power stored in a snubbing capacitor. A snubbing capacitor is used in a novel way to not only prevent the voltage at the switching transistors from rising instantaneously when the magnetic field in the inductive windings of the transformer tries to collapse, but is also used to provide the additional power needed when switching frequency increases. In my inventive circuit, the energy stored in the snubbing capacitor discharges into the low voltage power supply and is conserved. Thus, as the operating frequency increases, and the power required to charge the gates of the switching transistors increases, the snubber capacitor charges and discharges more often, providing more current to the low voltage circuit. A novel drive circuit is also disclosed which prevents two switching transistors from being on at the same time due to their non-instantaneous switching speeds. This is accomplished by a parallel diode and resistor combination coupled to the gates of each switching transistor so that the turn-on of each switching transistor is delayed slightly by the RC combination of the resistor and the gate to drain capacitance of each switching transistor. The turn-off of the gate, however, is quick due to the charge from the gate flowing through the diode. Thus, since the switches turn on relatively slowly but turn off quickly, the switching transistors are prevented from turning on at the same time.

DETAILED DESCRIPTION

General

Figure 1:
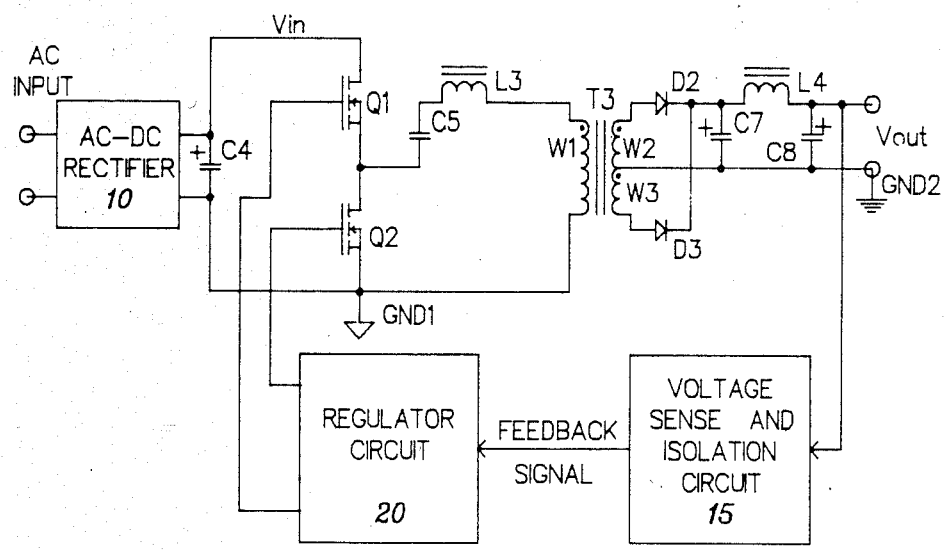
FIG. 1 shows a prior art symmetrical switching power supply.
Figure 2:
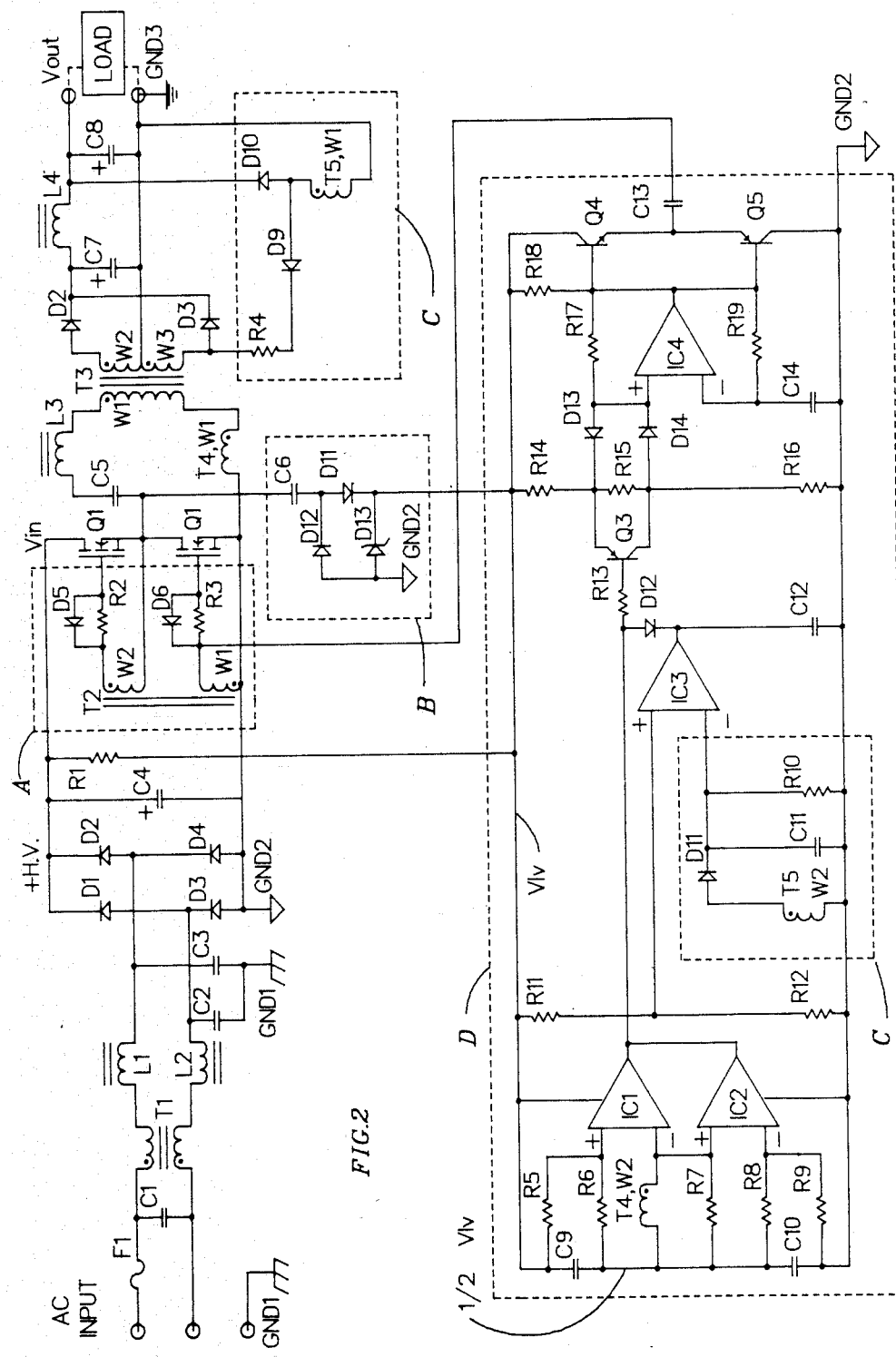
FIG. 2 shows the preferred embodiment of my invention incorporated into a symmetrical switching power supply.

FIG. 2 shows the preferred embodiment of the invention as incorporated in a symmetrical switching power supply, wherein an increased switching frequency of MOS switching transistors Q1 and Q2 results in a lower output voltage $V_{out}$ into an output load. As will be seen, my inventive oscillator may be used to also control switching duty cycle in a non-symmetrical switching power supply such as that shown in FIG. 3.

In FIG. 2, an AC input signal passes through fuse F1 to an EMI/RFI line interference circuit comprising capacitor C1, transformer T1, inductors L1 and L2, and capacitors C2 and C3. The AC signal is then rectified by diodes D1, D2, D3 and D4 and filtered by capacitor C4 to provide a high voltage DC input voltage $V_{in}$ to the switching power supply. MOS switching transistors Q1 and Q2 (bipolar transistors can easily be substituted with minor changes in design), coupled in series between $V_{in}$ and ground GND2, are alternately turned on and off by control circuit D and drive circuit A to drive their common point between ground GND2 and $V_{in}$. This common point is coupled to primary winding W1 of power transformer T3 through inductor L3 and capacitor C5 in series. Capacitor C5 serves to block the DC portion of input voltage $V_{in}$. Capacitor C5 and inductor L3 have varying impedances at varying frequencies, and by altering the switching frequency (a function performed by control circuit D), the current through winding W1 of power transformer T3 can be altered. It is by this means that power supply output voltage $V_{out}$ is controlled and regulated. Secondary and tertiary windings W2 and W3, respectively, have their common point coupled to ground and their respective ends coupled to anodes of diodes D2 and D3, respectively, so that when switching transistor Q1 is on, making the voltage at the dot-ends of all windings of power transformer T3 positive with respect to their non-dot-ends, the voltage across winding W2 forward biases diode D2 and supplies power to the output load while recharging filtering capacitor C7, filtering inductor L4, and filtering capacitor C8. When switching transistor Q1 is switched off and switching transistor Q2 is switched on, energy stored in capacitor C5, inductor L3, and power transformer T3 now causes current to flow through transistor Q2 into ground, thus causing the voltage across windings W2 and W3 to reverse polarity. The voltage across winding W3 now forward biases diode D3, and supplies power to the output load while recharging capacitor C7, inductor L4, and capacitor C8.

Operation of Voltage Sense Circuit C

In order to provide voltage regulation, voltage sense circuit C, which is described in the copending application entitled, "An Improved Voltage Regulator Circuit", by David T. Carroll, U.S. patent Ser. No. 07/137,787, Filed Dec. 23, 1987, submitted herewith and incorporated by reference, provides a feedback error signal corresponding to the difference between $V_{out}$ and a reference voltage. Voltage sense circuit C operates as follows. When switching transistor Q1 is on, the voltage across winding W3 of power transformer T3 is of a polarity to forward bias diode D9, whose cathode is coupled to the non-dot-end of winding W3 via resistor R4. The anode of diode D9 is coupled to primary winding W1 of sense transformer T5. Sense transformer T5 is designed so that when switching transistor Q1 is on, a current flows through primary winding W1 of sense transformer T5 which charges sense transformer T5 to saturation. Sense transformer T5 is prevented from releasing its energy since diode D11, coupled to secondary winding W2 of sense transformer T5, is reversed biased along with diode D10 coupled between the dot-end of sense transformer T5 and $V_{out}$.

When transistor Q1 is switched off and transistor Q2 is switched on, the voltage across winding W3 reverses and the current flowing into winding W1 of sense transformer T5 ceases. The magnetic field in the core of sense transformer T5 tries to collapse, reversing the polarities of the voltages across its windings. This reversal of the polarity of the voltage across winding W1 of sense transformer T5 forward biases diode D10, allowing energy to be released from the core of sense transformer T5 via winding W1 into the output load at a voltage of approximately $V_{out}+0.7$ volts, where 0.7 volts is the voltage drop across diode D10. The constant change in flux in the core of sense transformer T5 required to generate $V_{out}+0.7$ volts is reflected in the voltage across secondary winding W2 of sense transformer T5 and is of a polarity so as to forward bias diode D11 and charge capacitor C11 coupled between the cathode of diode D11 and ground. Resistor R10 in parallel with capacitor C11 serves to discharge capacitor 11 over a period of time so that capacitor C11 reflects an average voltage corresponding to $V_{out}$. This average voltage is then applied to a minus(−) terminal of voltage comparator IC3.

The plus(+) terminal of voltage comparator IC3 is coupled to a reference voltage set by a voltage divider comprising resistors R11 and R12 coupled in series between low voltage power supply voltage $V_{LV}$ and ground GND2. Thus, if the voltage across capacitor C11 is less than the reference voltage, the output of IC3 will be high, or an open circuit, and conversely, if the voltage across C11 is higher than the reference voltage, the output of IC3 will go to low, or to ground.

Operation of Oscillator and Frequency Control Circuit

The output of IC3 is coupled to one end of capacitor C12, whose other end is coupled to ground GND2 and to the cathode of diode D12. The anode of diode D12 is coupled to resistor R13, which is, in turn, coupled to the base of PNP transistor Q3. The anode of diode D12 is also coupled to an over-current protector means which drives the anode of diode D12 low when an over-current through power transformer T3 is detected.

The emitter of PNP transistor Q3 is coupled to voltage $V_{LV}$ via resistor 14, where resistor 14 is part of a voltage divider comprising resistors R14, R15, and R16 connected in series between $V_{LV}$ and ground GND2. Resistor R15 is connected between the emitter and collector of transistor Q3. Hence, if a high $V_{out}$ is detected by sense circuit C, causing the output of IC3 output to go low, charge is sinked from capacitor C12, and diode D12 becomes forward biased, driving the base of PNP transistor Q3 low and turning on transistor Q3. Conversely, if the magnitude of $V_{out}$ is below a predetermined amount, the output of IC3 will be an open circuit and capacitor C12 will charge to a high voltage through resistors R14 and R13 via the forward biased emitter/base junction of transistor Q3. When capacitor C12 charges to a level where the current drawn is insufficient to forward bias the emitter/base junction of transistor Q3, transistor Q3 turns off.

When transistor Q3 is on, it reduces the voltage across resistor R15. The voltage across resistor R15 determines the switching frequency of transistors Q1 and Q2 by reducing the difference between the high and low bias signals applied to the plus(+) terminal of voltage comparator IC4. This is accomplished as follows. The output of IC4 is coupled to voltage $V_{LV}$ via low value pull-up resistor R18 and coupled to capacitor C14 via resistor R19. Capacitor C14 is also coupled between the minus(−) terminal of IC4 and ground GND2. If the voltage at the plus(+) terminal of voltage comparator IC4 exceeds the voltage at its minus(−) terminal, the output of voltage comparator IC4 will be an open circuit, since IC4 is an open collector type voltage comparator operating at maximum gain. If the voltage of the plus(+) terminal is less than that at the minus (−) terminal, the IC4 output will be at ground voltage. When the output of IC4 is an open circuit, and, when the output of IC4 goes low, the charge on capacitor C14 gets sinked by IC4 through resistor R19. The plus(+) terminal of IC4 is coupled to the emitter of transistor Q3 via diode 13, whose anode is connected to the plus(+) terminal of IC4. The plus(+) terminal of IC4 is also connected to the collector of transistor Q3 via diode 14, whose cathode is connected to the plus(+) terminal of IC4. Resistor R17 is coupled between the output of IC4 and its plus(+) terminal in order to bias the anode of diode D13 and the cathode of diode D14. If the output of IC4 goes low, the plus(+) input thus can only go as low as the voltage present at the collector of transistor Q3 less the voltage drop across diode D14. Similarly, if the output of IC4 goes to $V_{LV}$ (by means of low impedance pull-up resistor R18), the plus(+) input can only go as high as the voltage present at the emitter of transistor Q3 plus the voltage drop across diode D13. Therefore, when the output of IC4 goes to $V_{LV}$ and capacitor C14 begins to charge, the voltage at the plus(+) terminal of IC4 will be that at the emitter of Q3 plus one diode drop, wherein the voltage at the emitter of Q3 is modulated by the amplitude of $V_{out}$. If $V_{out}$ exceeds a predetermined threshold level, transistor Q3 will be on, lowering its emitter voltage. This lowered voltage into the plus(+) terminal of IC4 will cause the voltage across capacitor 14 to exceed that voltage at the plus(+) terminal quicker, hence driving the output of IC4 low sooner than if $V_{out}$ was not above the predetermined threshold level. With the output of IC4 low, diode D14 is now forward biased, and the voltage at the plus(+) terminal is the voltage at the collector of transistor Q3 less one diode drop. When the output of IC4 is driven low, capacitor 14 discharges through resistor R19 until the voltage across C14 goes below the voltage now at the plus(+) terminal of IC4, driving the output of IC4 high.

As seen, the frequency of the resulting squarewave at the output of IC4 is increased by an increased signal from sense circuit C corresponding to an increase in $V_{out}$. This squarewave drives the emitter follower combination of transistors Q4 and Q5, which act as a current amplifier. The amplified squarewave is applied to primary winding W1 of drive transformer T2, in drive circuit A, via capacitor C13 in series with winding W1 of drive transformer T2. The function of capacitor C13 is to remove the DC portion of the signal and present to switching transistor Q2 and to winding W1 of drive transformer T2, a squarewave signal that goes positive and negative with respect to ground.

Operation of Drive Circuit A

Primary winding W1 and secondary winding W2 of drive transformer T2, along with associated components, are connected to switching transistors Q1 and Q2 such that voltage polarities across windings W1 and W2 alternately drive the gates of transistors Q1 and Q2.

An inherent problem with bridge or push-pull circuits when driving the transistors with a square-wave is that turning off one transistor means simultaneously turning on the other. Since there is storage time associated with transistors, and since they turn on much more quickly than they turn off, there would traditionally be an overlap time when both transistors are turned on. This would result in high currents flowing from $V_{in}$ to ground through Q1 and Q2 during the overlap time.

This is inefficient, generates lots of heat, and can be destructive to the transistors.

Drive circuit A makes use of the inherent gate/drain capacitance in transistors Q1 and Q2 to delay turn-on of the transistors to avoid simultaneous conduction. When transistor Q1 turns off, the inherent drain-source diode of transistor Q2 becomes forward biased and conducts inductive energy stored in inductor L3 and transformer T3 even when transistor Q2 is off. Thus, it is not important for transistor Q2 to turn on quickly. Resistor R3 is placed between the gate of transistor Q2 and the non-dot-end of winding W1 of drive transformer T2 to slow the charging of the gate. Diode D6 is placed in parallel with resistor R3 to enable the gate of transistor Q2 to discharge quickly and avoid simultaneous conduction with transistor Q1 when the control signal voltage polarity reverses and the gate of transistor Q1 begins to charge.

Similarly, the turn-on time of transistor Q1 is delayed by the insertion of resistor R2 between its gate and the dot-end of winding W2 of drive transformer T2, and diode D5 is placed in parallel with resistor R2 for rapid turn-off. Thus, a novel method of overcoming conduction overlap in bridge or push-pull type circuits is disclosed.

Operation of Over-Current Protection Circuit

An over-current protection circuit is also shown in FIG. 2, which uses current sense transformer T4 to detect when the current through winding W1 of power transformer T3 exceeds a predetermined level. Primary winding W1 of current sense transformer T4 has its dot-end connected to winding W1 of power transformer T3 and its non-dot-end connected ground GND2. Secondary winding W2 of current sense transformer T4 has its non-dot-end coupled to a voltage of approximately ½ $V_{LV}$ set by a voltage divider comprising capacitors C9 and C10 coupled in series between $V_{LV}$ and ground GND2, wherein one end of winding W2 of current sense transformer T4 is connected to the common point of capacitors C9 and C10. The other end of winding W2 of current sense transformer T4 is coupled to a minus(−) terminal of voltage comparator IC1 and a plus(+) terminal of voltage comparator IC2, both voltage comparators are open collector types operating at maximum gain. The plus(+) terminal of voltage comparator IC1 is coupled to a reference voltage set by a voltage divider comprising resistors R5 and R6 in series across capacitor C9. The minus(−) terminal of voltage comparator IC2 is coupled to a reference voltage set by a voltage divider comprising resistors R8 and R9 in series across capacitor C10. As the current through primary winding W1 of power transformer T3 flows through winding W1 of current sense transformer T4 in either direction, the magnitude of the current is reflected in secondary winding W2 of current sense transformer T4. Resistor R7 is placed across winding W2 of current sense transformer T4 to load the winding so that the voltage across winding W2 corresponds to the current through winding W1 of current sense transformer T4. Thus, when the current through winding W1 of current sense transformer T4 is high enough, the output of IC1 or IC2, depending on the direction of current flow through winding W1 of current sense transformer T4, will go low. This low state causes transistor Q3 to be highly conductive, resulting in an increase in the switching frequency and a lowering of current through winding W1 of power transformer T3 and current sense transformer T4 until the over-current condition has passed. As seen, when the output of either IC1 or IC2 is low, the switching frequency increases irrespective of the state of IC3.

Operation of Low Voltage Power Supply Circuit B and Low Loss Snubber

Also shown in FIG. 2 is low voltage supply circuit B, which is a novel circuit for efficiently generating low voltage power for the control circuitry. In the types of converters presented here, more power is needed when switching frequency is increased. This is because biasing a gate on and off results in losses due to the intrinsic gate-drain capacitor having to be charged and discharged, which results in one-half of the stored energy in the gate-drain capacitor being lost resistively in the form of heat. This low voltage supply makes use of a snubbing capacitor, which is normally used to (1) reduce dangerous ring voltages as a result of stray capacitance (2) increase the efficiency and reliability of the circuit by improving the load line of the switching transistors; and (3) increase the efficiency of the circuit by reducing high frequency harmonics in the magnetic devices subject to the squarewaves. Capacitor C6, coupled to the common point of transistors Q1 and Q2, acts as the snubbing capacitor. It operates by storing energy when switching transistor Q1 is on. When switching transistor Q1 turns off, the current flow through inductor L3 is interrupted. The magnetic field in inductor L3 will try to collapse causing the voltage across inductor L3 to reverse polarity. Without snubbing capacitor C6, this voltage change will be virtually instantaneous, resulting in a rapid increase in voltage at the common point of transistors Q1 and Q2. It is this rapid increase in voltage that would deteriorate the load line of transistor Q1 and Q2 due to internal effects. The addition of capacitor C6 in the circuit prevents the voltage from flying up or down instantaneously and, instead, establishes a resonant circuit with a period defined by the following equation:

$$Period = 2\pi(LC)^{\frac{1}{2}}$$

Where:
  L = inductance of L3 in henries
  C = capacitance of C6 in farads.

By insertion of diode D11 and zener diode D13 between capacitor C6 and ground GND2, current through capacitor C6 also flows through those two diodes and a portion or all of the current can be used to recharge, as required, capacitors C9 and C10. This augments the steady state low voltage power provided by resistor R1 and zener diode D13 coupled between input voltage $V_{in}$ and ground GND2. Diode D12 conducts the flow of current when transistor Q1 is switched off, where diode D11 blocks the energy from being released from the low voltage supply to capacitor C6. As the operating frequency increases, the power required from the low voltage power supply increases. Since snubbing capacitor C6 charges and discharges more often, current flows into diodes D11 and D13 more often, resulting in an increased power being made available. Thus, a lossless snubber and efficient low voltage power supply are disclosed.

Operation of Oscillator as Pulsewidth Modulator

Figure 3:
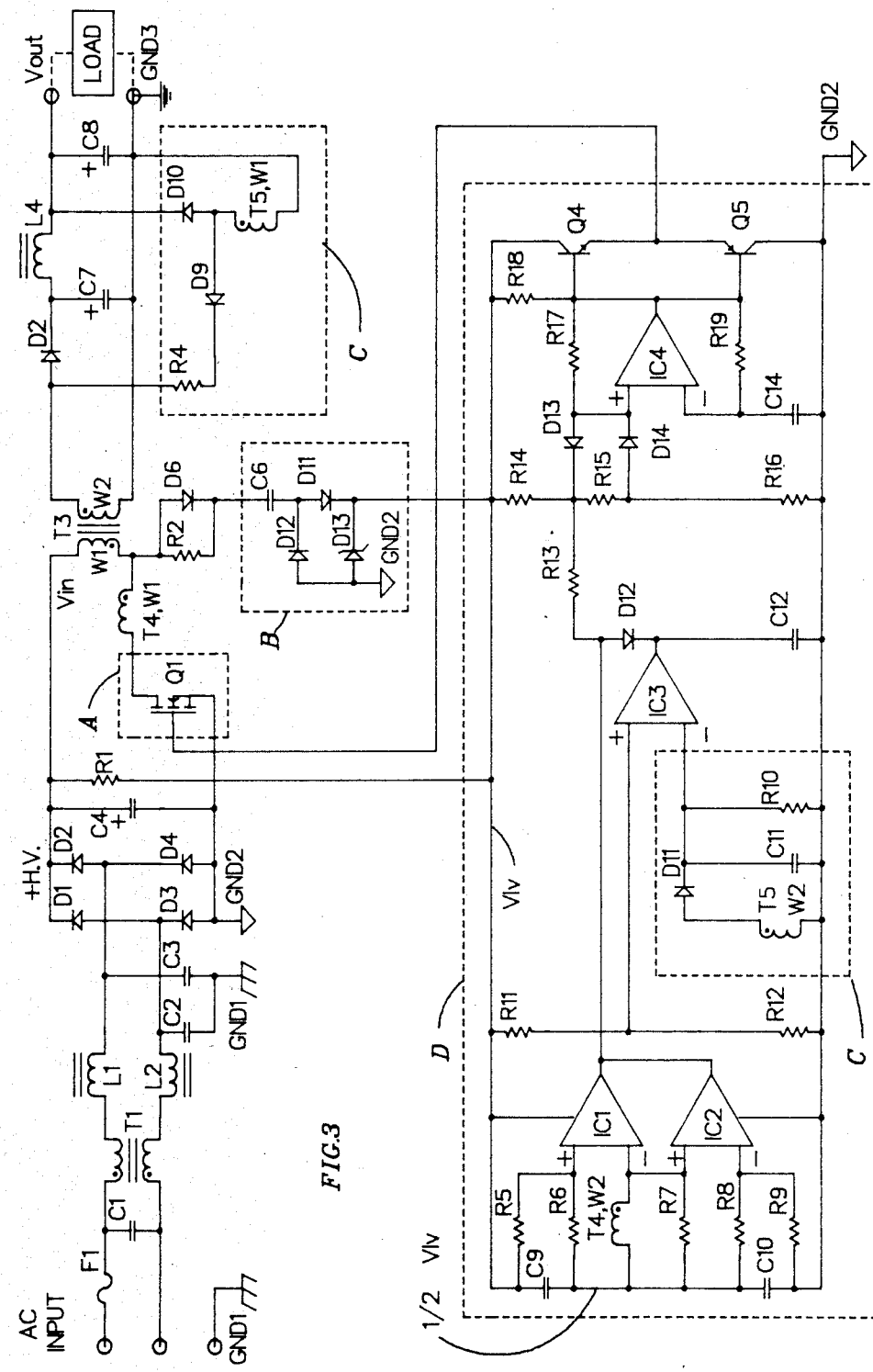
FIG. 3 shows the preferred embodiment of my invention incorporated into a non-symmetrical switching power supply.

FIG. 3 illustrates a non-symmetrical flyback type switching power supply wherein all components function identically as the corresponding components of FIG. 2. The following changes to FIG. 2 have been made to configure the power supply of FIG. 2 as a non-symmetrical switching power supply: (1) the squarewave control signal produced at the common emitters of transistors Q4 and Q5 now directly controls switching transistor Q1; (2) the dot-end of winding W1 of power transformer T3 has been reversed; (3) winding W3 of power transformer T3 has been eliminated; (4) transistor Q3 has been eliminated and resistor R13 now connects to the junction of resistor R14, resistor R15, and diode D13; and (5) snubbing capacitor C6 couples low voltage power supply circuit B to the dot-end of winding W1 of power transformer T3 via resistor R2 and diode D6 connected in parallel. The operation of flyback type switching power supply is well-known, and a detailed description of one can be found in the copending application entitled, "Novel Control Circuit for Non-Symmetrical Switching Power Supply", by David T. Carroll, U.S. patent Ser. No. 07/137,786, Filed Dec. 23, 1987, submitted herewith and herein incorporated by reference.

When transistor Q1 is switched on, power transformers T3 stores energy. The output load during this time is being supplied the necessary power by capacitor C7, inductor L4, and capacitor C8. When transistor Q1 is switched off, the voltage polarity across winding W2 of power transformer T3 reverses and forward biases diode D2, hence, supplying power to the output load and recharging the output filtering components. Output voltage $V_{out}$ is determined by the duty cycle (time on/-time off) of the quasi-squarewave control signal controlling transistor Q1. A pulsewidth modulated signal may be provided at the output of IC4 by adjusting the high and low bias voltages at the plus(+) terminal of IC4.

Figure 4:
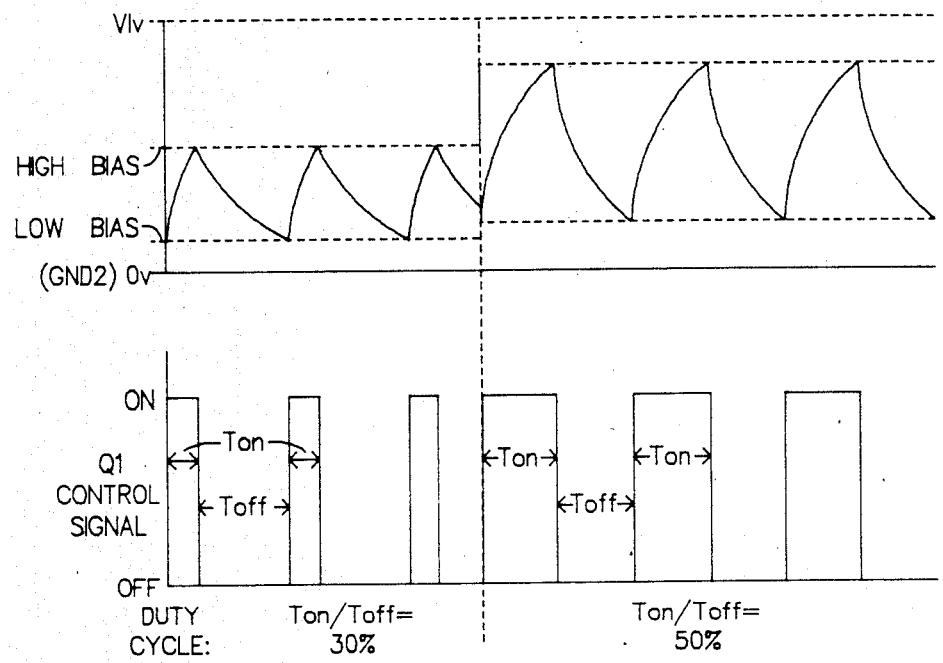
FIG. 4 shows a voltage versus graph of a capacitor discharging and charging and the voltage threshold levels which determine switching frequency and/or duty cycle.

As shown in FIG. 4, if the low and high bias voltages are set closer to ground GND2, the duty cycle at the output of IC4 will be low since capacitor C14 takes longer to discharge down to the low bias voltage than to charge to the high bias voltage. If an increase $V_{out}$ is sensed by sense circuit C, IC3 will draw current and lower the high and low bias voltages at the plus(+) terminal of IC4. This reduces the amount of time for capacitor C14 to charge to the high bias voltage, and in doing so, lowers the duty cycle of the control signal into switching transistor Q1. Thus, an inexpensive pulsewidth modulator is disclosed.

Conclusion

A novel control circuit has been disclosed which can provide a frequency modulated squarewave, while performing as a voltage controlled oscillator (VCO), or a pulsewidth modulated squarewave. This inexpensive circuit may be easily incorporated in most symmetrical and non-symmetrical switching power supplies. A novel low loss snubber and efficient low voltage power supply has also been disclosed along with a novel drive circuit, which prevents simultaneous conduction of switching transistors. The concepts behind these novel circuits may also be applied to other uses, such as in communications, where a VCO is useful for a phase locked loop.

Other embodiments using the concepts behind my inventive circuits will be obvious to those skilled in the art. Accordingly, while the invention has been particularly shown and described with reference to the preferred embodiment thereof, it will be understood by those skilled in the art that deviations may be made therein without departing from the spirit and scope of the invention.

I claim:

1. A voltage controlled oscillator (VCO) of the type used in a symmetrical switching power supply wherein the frequency of a squarewave control signal produced at an output terminal of said VCO, said control signal controlling a switching means to drive current symmetrically positive and negative through a magnetic device, controls a DC output voltage of said power supply, and wherein said frequency of said control signal is controlled by a VCO input signal, said VCO comprising:

a voltage comparator means having a plus(+) terminal and a minus(−) terminal, wherein if a voltage at said plus(+) terminal exceeds a voltage at said minus(−) terminal, said output terminal of said voltage comparator means will be at a high voltage, and if said voltage at said minus(−) terminal exceeds that voltage at said plus(+) terminal, said output terminal of said voltage comparator means will be at a low voltage;

a first resistor with one end coupled to said output terminal of said voltage comparator means;

a capacitor coupled between said resistor and a ground wherein said capacitor is coupled to said minus(−) terminal of said voltage comparator means, wherein said capacitor charges up when said output terminal of said voltage comparator means is at a high voltage and discharges when said output terminal of said voltage comparator means is at a low voltage;

a voltage divider formed by a plurality of resistors for providing a high bias voltage and a low bias voltage corresponding to voltages at each end of one of said plurality of resistors, wherein each end of said one of said plurality of resistors is coupled to sai plus(+) terminal of said voltage comparator means via a diode, and wherein said plus(+) terminal of said voltage comparator means is also coupled to said output terminal of said voltage comparator means via a second resistor so that when said output terminal of said voltage comparator means is at a high voltage, said high bias voltage will be coupled to said plus(+) terminal, and when said output terminal of said voltage comparator means is at a low voltage, said low bias voltage will be coupled to said plus(+) terminal, resulting in said capacitor charging to approximately said high bias voltage when said output terminal of said voltage comparator means is at a high voltage and discharging to said low bias voltage when said output terminal of said voltage comparator means is at a low voltage; and, a transistor means coupled to said voltage divider for shunting said one of said plurality of resistors forming said voltage divider and controlling the voltage difference between said high bias voltage and said low bias voltage, in response to said VCO input signal applied to a control terminal of said transistor, in order to control the frequency of said voltage at said output terminal of said voltage comparator means, said voltage at said output terminal being a squarewave.

2. A switching power supply comprising:

switching means for controlling current through a magnetic device;

rectifying and filtering means coupled to an output of said magnetic device for suppling power to an output load;

a drive circuit coupled to receive a control signal and coupled to control said switching means;

an oscillator coupled to said drive circuit for providing a squarewave control signal to said drive circuit, said squarewave control signal being modulated by a voltage applied to an input terminal of said oscillator, said oscillator comprising a voltage comparator means having a plus (+) terminal and a minus (−) terminal, and having an output terminal, wherein if a voltage at said plus(+) terminal exceeds a voltage at said minus(−) terminal, said output terminal of said voltage comparator means will be at a high voltage, and if said voltage at said minus(−) terminal exceeds that voltage at said plus(+) terminal, said output terminal of said voltage comparator means will be at a low voltage, a first resistor with one end coupled to said output terminal of said voltage comparator means, a capacitor coupled between said resistor and a ground wherein said capacitor is coupled to said minus(−) terminal of said voltage comparator means, wherein said capacitor charges up when said output terminal of voltage comparator means is at a high voltage and discharges when said output terminal of said voltage comparator means is at a low voltage, a voltage divider formed by a plurality of resistors for providing a high bias voltage and a low bias voltage corresponding to voltages at each end of one of said plurality of resistors, wherein each end of said one of said plurality of resistors is coupled to said plus(+) terminal of said voltage comparator means via a diode, and wherein said plus(+) terminal of said voltage comparator means is also coupled to said output terminal of said voltage comparator means via a second resistor so that when said output terminal of said voltage comparator means is at a high voltage, said high bias voltage will be coupled to said plus(+) terminal, and when said output terminal of said voltage comparator means is at a low voltage, said low bias voltage will be coupled to said plus(+) terminal, resulting in said capacitor charging to approximately said high bias voltage when said output terminal of said voltage comparator means is at a high voltage and discharging to said low bias voltage when said output terminal of said voltage comparator means is at a low voltage, and a transistor means coupled to said voltage divider for shunting said one of said plurality of resistors forming said voltage divider and controlling the voltage difference between said high bias voltage and said low bias voltage in order to control the frequency of said voltage at said output terminal of said voltage comparator means, said voltage at said output terminal being a squarewave;

a voltage sense circuit coupled to receive an output voltage of said power supply and provide a corresponding signal to said input terminal of said oscillator; and a low voltage power supply coupled to said drive circuit, to said oscillator, and to said voltage sense circuit for providing power.

3. The switching power supply of claim 2 wherein said low voltage power supply comprises a snubbing capacitor coupled to said magnetic device for preventing instantaneous voltage swings across said magnetic device, wherein said snubbing capacitor is also coupled to an anode of a first diode and a cathode of a second diode, wherein a cathode of said first diode is coupled to a zener diode, and an anode of said second diode is coupled to a ground so that current through said zener diode as a result of snubbing action by said snubbing capacitor is not wasted resistively but is stored in a storing means coupled to said zener diode to provide additional power to said circuits being powered by said low voltage power supply.

4. The switching power supply of claim 2 wherein said drive circuit comprises a drive transformer with a primary winding coupled to receive said control signal and a secondary winding for generating a voltage across said secondary winding of a polarity opposite that across said primary winding, wherein said voltage across said secondary winding is coupled to a gate of a first switching transistor, said first switching transistor forming part of said switching means, via a third resistor and a first diode, wherein said gate of said switching transistor charges slowly due to the combination of said third resistor and inherent gate-drain capacitance of said first switching transistor and discharges quickly through said first diode, and wherein said voltage across said primary winding is applied to a gate of a second switching transistor, said second switching transistor forming part of said switching means, via a fourth resistor and a second diode so that said gate of said second transistor charges slowly due to the combination of said fourth resistor and inherent gate-drain capacitance of second switching transistor and discharges quickly through said second diode, and wherein said first and second switching transistors are switched alternately and are prevented from simultaneous conduction due to the delay in turn-on time.

5. A switching power supply comprising:

switching means for controlling current through a magnetic device;

rectifying and filtering means coupled to an output of said magnetic device for supplying power to an output load;

a drive circuit coupled to receive a control signal and coupled to control said switching means;

a pulsewidth modulator coupled to said drive circuit for providing a control signal to said drive circuit, said control signal having a duty cycle modulated by a voltage applied to an input terminal of said pulsewidth modulator, said pulsewidth modulator comprising a voltage comparator means having a plus(+) terminal and a minus(−) terminal, and having an output terminal, wherein if a voltage at said plus(+) terminal exceeds a voltage at said minus(−) terminal, said output terminal of said voltage comparator means will be at a high voltage, and if said voltage at said minus(−) terminal exceeds that voltage at said plus(+) terminal, said output terminal of said voltage comparator means will be at a low voltage, a first resistor with one end coupled to said output terminal of said voltage comparator means, a capacitor coupled between said resistor and a ground wherein said capacitor is coupled to said minus(−) terminal of said voltage comparator means, wherein said capacitor charges up when said output terminal of voltage comparator means is at a high voltage and discharges when said output terminal of said voltage comparator means is at a low voltage, a first voltage divider formed by a plurality of resistors for providing a high bias voltage corresponding to the voltage at one end of one of said plurality of resistors wherein said one end of said one of said plurality resistors, is coupled to said plus(+) terminal of said voltage comparator means via a diode, and wherein said plus(+) terminal of said voltage comparator means is also coupled to said output terminal of said voltage comparator means via a second resistor so that when said output terminal of said voltage comparator means is at a high voltage, said high bias voltage will be coupled to said plus(+) terminal, a second voltage divider providing a fixed low bias voltage, wherein said fixed low bias voltage is coupled to said plus(+) terminal of said voltage comparator means via a diode so that when said output terminal of said voltage comparator means is at a low voltage, said fixed low bias voltage will be coupled to said plus(+) terminal of said voltage comparator means, resulting in said capacitor charging to approximately said high bias voltage when said output terminal of said voltage comparator means is at a high voltage and discharging to said fixed low bias voltage when said output terminal of said voltage comparator means is at a low voltage, and a transistor means coupled to said first voltage divider for shunting said one of said plurality of resistors forming said voltage divider and controlling the voltage of said high bias voltage in order to control duty cycle of said voltage at said output terminal of said voltage comparator means;

a voltage sense circuit coupled to receive an output voltage of said power supply and provide a corresponding signal to said input terminal of said oscillator; and a low voltage power supply coupled to said drive circuit, said oscillator, and said voltage sense circuit for providing power.

* * * * *